(12) United States Patent
Chang

(10) Patent No.: US 7,132,751 B2
(45) Date of Patent: Nov. 7, 2006

(54) MEMORY CELL USING SILICON CARBIDE

(75) Inventor: Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/874,557

(22) Filed: Jun. 22, 2004

(65) Prior Publication Data

US 2005/0280001 A1   Dec. 22, 2005

(51) Int. Cl.
  *H01L 23/48* (2006.01)
  *H01L 23/52* (2006.01)
  *H01L 29/40* (2006.01)
  *H01L 27/10* (2006.01)
  *H01L 29/739* (2006.01)

(52) U.S. Cl. .............. 257/758; 257/202; 257/204; 257/206; 257/207; 257/208; 257/210; 257/211; 257/331; 257/347; 257/401; 257/750; 257/759; 257/760

(58) Field of Classification Search ........... 257/202, 257/204, 206–208, 210, 331, 401, 758–760
  See application file for complete search history.

(56) References Cited

U.S. PATENT DOCUMENTS

| | | | |
|---|---|---|---|
| 5,005,060 A * | 4/1991 | Mazzali | 365/185.16 |
| 5,307,305 A * | 4/1994 | Takasu | 365/145 |
| 5,382,540 A | 1/1995 | Sharma | |
| 5,656,837 A * | 8/1997 | Lancaster et al. | 257/314 |
| 5,929,477 A | 7/1999 | McAllister Burns, Jr. | |
| 5,982,004 A * | 11/1999 | Sin et al. | 257/347 |
| 6,235,568 B1 | 5/2001 | Murthy | |
| 6,624,032 B1 | 9/2003 | Alavi | |
| 6,687,152 B1 * | 2/2004 | Ohsawa | 365/149 |
| 6,933,527 B1 * | 8/2005 | Isobe et al. | 257/59 |
| 2002/0130350 A1 * | 9/2002 | Shin et al. | 257/314 |
| 2004/0070047 A1 * | 4/2004 | Majumdar et al. | 257/510 |
| 2004/0135175 A1 * | 7/2004 | Kurokawa | 257/207 |
| 2004/0161886 A1 * | 8/2004 | Forbes et al. | 438/198 |
| 2004/0262699 A1 * | 12/2004 | Rios et al. | 257/401 |
| 2005/0145938 A1 * | 7/2005 | Lin | 257/347 |
| 2005/0199882 A1 * | 9/2005 | Sankin et al. | 257/77 |

* cited by examiner

*Primary Examiner*—Ida M. Soward
(74) *Attorney, Agent, or Firm*—Schwabe, Williamson & Wyatt, P.C.

(57) ABSTRACT

A memory includes an insulating layer; a plurality of spaced-apart semiconductor lines formed on the insulating layer; and a plurality of spaced-apart conductive gate lines formed on the insulating layer. Each of the gate lines is disposed to intersect the plurality of semiconductor lines at a plurality of intersections. The semiconductor lines include a plurality of body regions disposed at the intersections, with each of the body regions including a channel formed from a silicon carbide material.

20 Claims, 17 Drawing Sheets

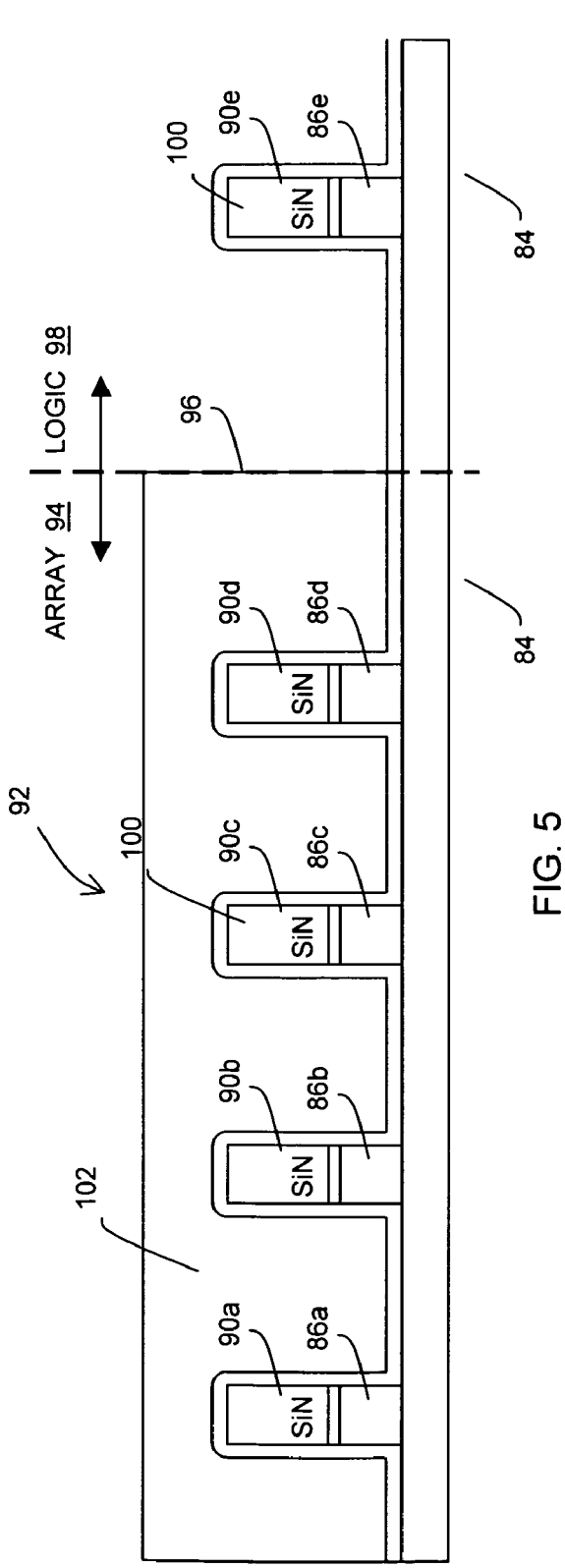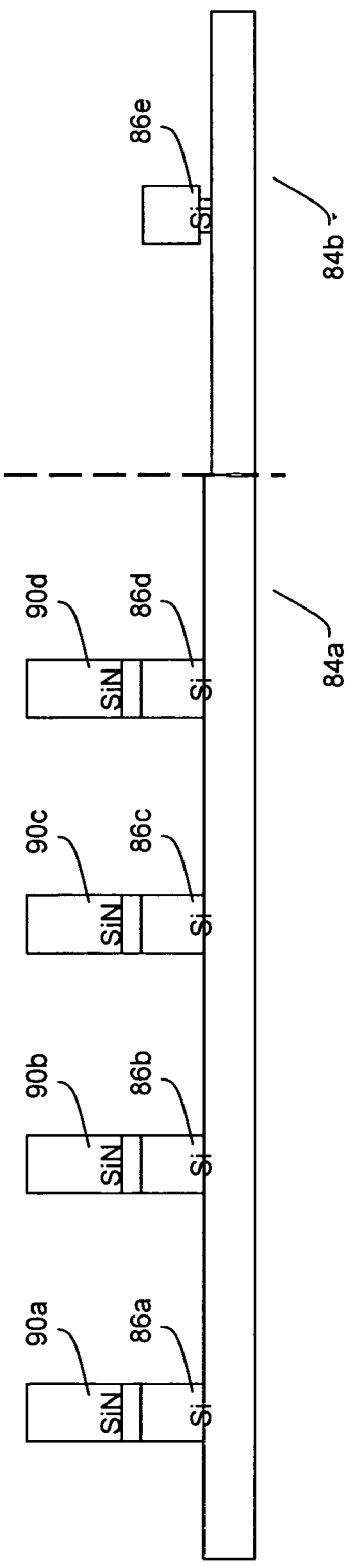
FIG. 5
FIG. 6

Drain Valence
Band at Vd = 0V

MEMORY CELL USING SILICON CARBIDE

BACKGROUND OF THE INVENTION

1. Field of the Invention

The present invention relates to electronic devices, and in particular, to memory electronic devices.

2. Description of Related Art

Most common dynamic, random-access memories (DRAMs) cells store charge on a capacitor and use a single transistor for accessing the capacitor. More recently, a memory cell has been proposed which stores charge in a floating body of a transistor. In this memory cell, a back gate is biased to retain charge in the floating body. An oxide layer is formed on a silicon substrate and a silicon layer for the active devices is formed on the oxide layer. The silicon substrate is used as the back gate, and consequently, must be biased relative to the silicon layer. Unfortunately, the oxide layer is relatively thick, requiring a relatively high voltage for the bias. Several gate structures have been proposed to reduce this relatively high bias potential, including use of a double gate, a split-gate and silicon pillars. The double gate and silicon pillar structures are relatively difficult to fabricate.

Referring to FIG. 1, a double-gate, floating-body memory cell or transistor 10 is illustrated. The memory cell 10 is formed on a P-doped substrate 12 and includes an active region comprising an N+ type source 14, an N+ type drain 16, and a P type channel 18. The memory cell 10 further includes an N+ type front gate 20 disposed on one side of the channel 18 and a P+ type back gate 22 formed in a buried oxide layer 24 disposed on the other side of the channel 18. The buried oxide layer 24 is formed on top of the P-type silicon substrate 12. The active region is formed of silicon. A dynamic, random-access memory (DRAM) is formed from a memory array (not shown) of the memory cells 10. The memory array has rows of different word-lines formed by a plurality of interconnected front gates 20 of individual cells 10 and columns of different bit lines coupled to a plurality of drains 16 of individual cells 10 along each bit line, with all of the sources 14 of the cells 10 being commonly coupled.

The threshold voltage of the memory cell 10 is programmable or adjustable, based upon the charge stored on the back gate 22. The back gate 22 is used to create a potential where holes may accumulate. More specifically, a state "1" and a state "0" may be associated with charges and with no charges, respectively, being stored on the back gate 22. For the state "1", the back gate 22 is biased at a voltage to retain the charges. For the state "0", due to junction leakages, charges eventually build up in the back gate 22, making the state "0" indistinguishable from the state "1." Hence, the memory cell 10 needs to be periodically refreshed at sufficiently frequent intervals to avoid the states from becoming indistinguishable. The "retention time" may be defined as the time permitted between refreshing the back gate 22 before the state "0" is lost. The retention time of silicon may be longer than 1 second at room temperature. However, the retention time is degraded by more than 300 times from room temperature to 110 degrees C. due to the small energy bandgap in silicon. The retention time can be further reduced with small memory cells 10 due to surface defects. In summary, the retention time difficulty is an intrinsic problem of silicon; hence, application of a silicon-based memory cell 10 to sub-100 nm devices may be marginal.

Fabrication of the back gate 22 creates another difficulty with the floating body memory cell 10. Electrical contacts to the back gate 22 still take up quite a bit of cell area. The letter "F" designates the minimum line width of a feature size that may be patterned with lithography. The contacts to the back gate 22 prevent the memory cell 10 from having a cell memory area of 4 $F^2$.

To fabricate the memory cell 10, Silicon-on-Insulator (SOI) technology is used. Fabrication starts with a lightly doped silicon wafer having an insulating silicon dioxide ($SiO_2$) layer 24, i.e., buried oxide layer, formed by use a SIMOC (Separation by Implantation of Oxygen) process or a BESOI (BondEd SOI) process. This creates a thin layer of silicon above the buried oxide layer 24 and a thick layer underneath which forms the P-substrate 12. The active region (source 14, drain 16, and channel 18) of the memory cell 10 is constructed on the thin layer of silicon above the buried oxide layer 24.

Silicon carbide (SiC)-on-insulator wafers have been made. MOS and bipolar devices have been made on a silicon carbide crystal for power applications and non-volatile memory. MOS and bipolar devices also have been demonstrated with silicon carbide-on-silicon (SiC-on-Si) materials.

BRIEF DESCRIPTION OF THE DRAWINGS

FIG. 5 is a cross-sectional, elevation view of the structure of FIG. 4 and a section of the substrate used for the memory's peripheral circuits according to the first embodiment of the present invention.

FIG. 6 illustrates the structure of FIG. 5 after additional processing which removes oxide layers according to the first embodiment of the present invention.

FIG. 12A is taken through section line 12A—12A of FIG. 10.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

In a first embodiment according to the present invention, silicon carbide (SiC) is used as a material for a floating body memory cell of a memory array to improve retention time at high temperatures. In second embodiment according to the present invention, silicon carbide-on-silicon (SiC-on-Si) is used as the material for a floating body memory cell of a memory array to improve the retention time at high temperatures. In these two embodiments, the low leakage in SiC or SiC-on-Si may be utilized to improve the retention time. In a third embodiment, the band-alignment between silicon carbide and silicon is used to make a floating body memory cell of a memory array that may eliminate the need for a back gate used to retain charges in the floating body memory cell. More specifically, use of band alignment between the silicon carbide and the silicon creates a charge storage pocket in the body of the memory cell that may eliminate the need for the back gate. Without the back gate, the cell area of the memory cell may be reduced to 4 $F^2$.

Figure 2:
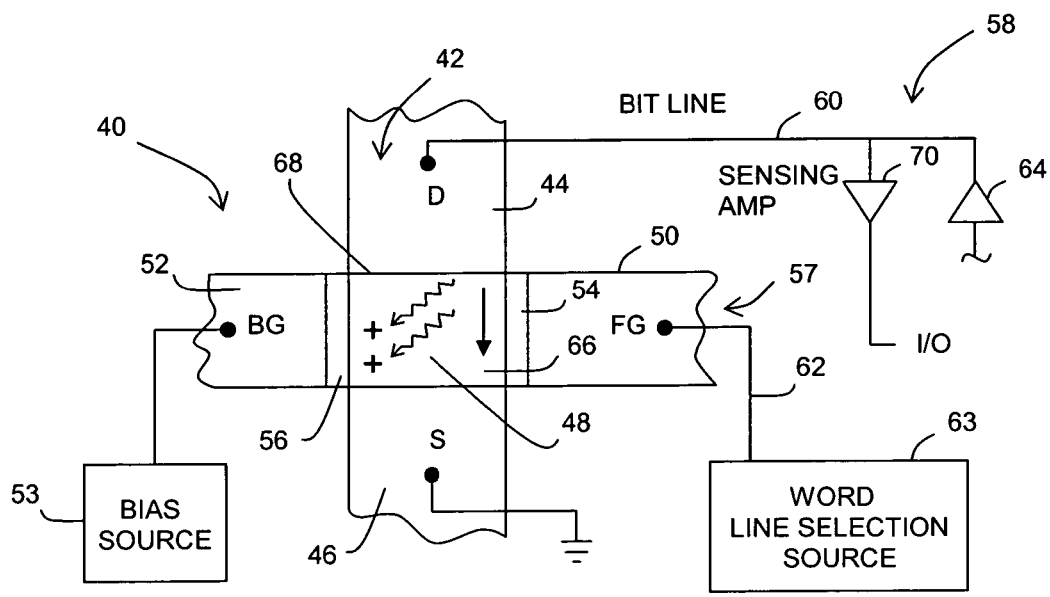
FIG. 2 is a schematic circuit diagram of a split-gate, floating body memory cell in accordance with a first and a second embodiment of the present invention.

Referring to FIG. 2, a schematic diagram is shown of a split gate, floating-body memory cell 40 used in the first two above-described embodiments according to the present invention. A plurality of the memory cells 40 form a memory array to be described hereinafter. A portion of a silicon carbide line 42 (i.e., semiconductor line), formed on an oxide layer (not shown) and etched from a silicon carbide layer, is illustrated. The line 42 may include a pair of spaced-apart, doped drain and source regions 44 and 46, disposed adjacent to a first pair of opposed sides of a silicon carbide body region 48. In one embodiment, the body region may be a P-type region, and the source region 46 and drain region 44 may be more heavily doped with an N+ type dopant. A pair of gates, identified as a front gate 50 and back gate 52, may be positioned adjacent to a second pair of opposed sides of the body region 48. The gates 50 and 52 may be insulated from the body region 48 by the oxide layers 54 and 56, respectively. The gates may be formed from a conductive gate line 57, a portion of which is shown in FIG. 2. In one embodiment, the gate line 57 may be made of polysilicon and etched from a polysilicon layer. The polysilicon gate line 57 forming the gates is generally perpendicular to the silicon carbide line 42 and is interrupted by the silicon carbide line 42 at the body region 48. The memory cell 40 may be a four-terminal device, coupled to the peripheral circuits 58 of the memory cell. For the n-channel embodiment illustrated, the source region 46 may be coupled to ground and the back gate 52 may be coupled to a voltage bias source 53, which may provide a bias voltage to the back gate 52. A terminal of the drain region 44 may be connected to a bit line 60 in the memory array. The front gate 50 may form part of a word-line 62 in the memory cell 40 to allow selection of the memory cell 40. A word-line selection source 63 may provide a voltage which selects the word-line 62. The memory cell 40, as will be described, may be a dynamic, random access memory cell, and as such, the data stored requires periodic refreshing.

In describing the operation of the memory cell 40, first it will be assumed that the memory cell 40 is not storing charge and is selected by the application of a positive potential to the word-line 62 which is coupled to the front gate 50. It will be further assumed that a binary one is to be stored in (written into) the cell 40 as represented by the storage of charge. (A binary 0 is represented by the absence of charge.) A bit line driving amplifier 64 of the peripheral circuitry 58 may provide a positive potential to the bit line 60 causing conduction in an inversion channel 66 of the body region 48, similar to what occurs in a field-effect transistor. As this occurs, hole pairs (resulting generally from impact ionization) drift towards the gate 52 under the influence of the bias applied to this gate. These hole pairs remain in a storage region 68 of the body region 48 after the potential is removed from the word-line 62 and the potential is removed from the bit line 60. Next, it will be assumed that it is necessary to determine whether the cell 40 is storing a binary 1 or binary 0. The cell 40 may be selected by the application of a positive potential to the word-line 62. The threshold voltage of the cell 40 shifts, depending on whether holes are stored in the region 68. The cell 40 has a lower threshold voltage, that is, it conducts more readily, when there is charge stored in the region 68. This shift in threshold voltage is sensed by a sensing amplifier 70 and provides a reading of whether the cell is storing a binary 1 or binary 0. In some embodiments, latches may be placed after the sensing amplifier 70. This received signal may be provided to an I/O output line or to refresh circuitry to refresh the state of the cell.

Figure 1:
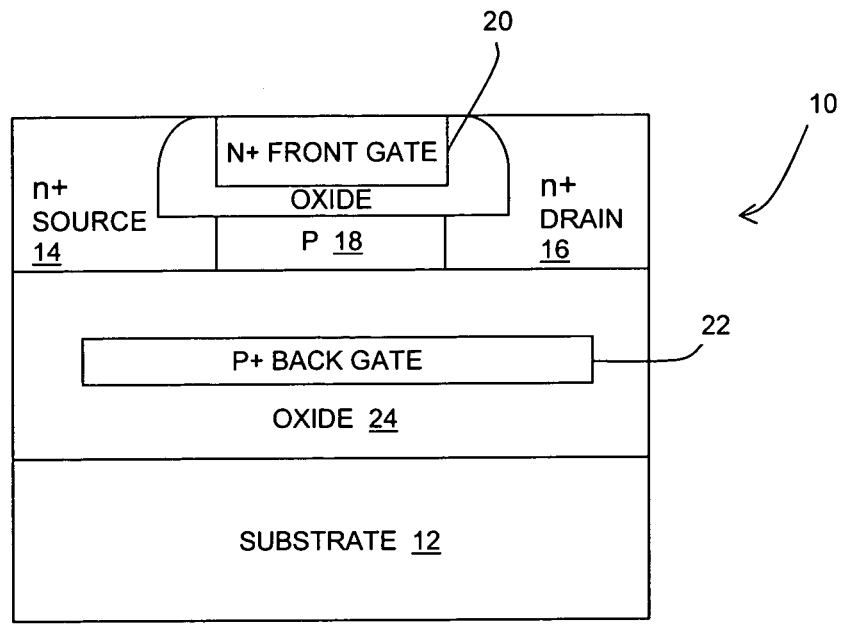
FIG. 1 is a diagram of a conventional double-gate, floating body memory cell.

The first embodiment of the memory cell 40 according to the present invention is silicon carbide based. Silicon carbide is a semiconductor with high band gap (i.e., gap between energy bands for allowed energy states of electrons) with very low junction leakages at room and high temperatures. The junction leakage of silicon carbide may be over 8 orders of magnitude smaller than silicon, which may eliminate the previously described retention time issue. In the fabrication of the memory cell 40, a SiC-on-insulator wafer may be used as the starting material instead of a silicon-on-insulator (SOI) wafer. The structure and fabrication process for the first embodiment is described in FIGS. 4–15. Unlike the double-gate described in FIG. 1, with the spit-gate of memory cell 40, the gate may be originally connected and then split into two pieces by the silicon process. A split-gate may result in a simpler manufacturing process. By laying out the gate in the same plane, the processing steps may be simplified.

With this fabrication process to fabricate the memory cell 40, the process may start with a SiC-on-insulator wafer 80. As with the SOI wafer described in the prior art section, the wafer 80 may be formed by a SIMOC (Separation by Implantation of Oxygen) process or a BESOI (BondEd SOI) process. As a result, the wafer 80 may include a silicon carbide substrate 82, a buried oxide layer 84, and a silicon carbide layer 86. Active devices (source region, drain region, and body region) may be fabricated in the relative thin active region of the crystalline silicon carbide layer 86, which is disposed on the oxide layer 84. In the subsequent FIGS., the wafer for the memory array is shown fabricated on the buried oxide layer 84, with the underlying silicon substrate 82 not being shown.

Figure 3:
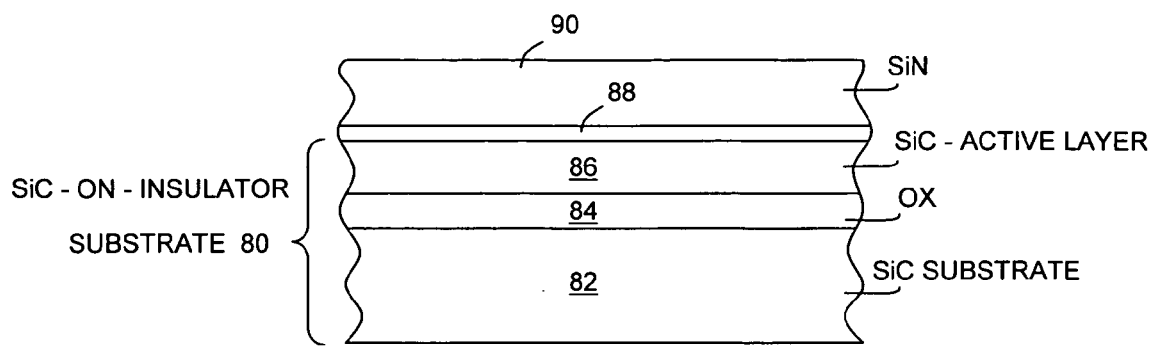
FIG. 3 is a cross-sectional, elevation view of a SOI wafer and additional layers for starting fabrication of a memory array according to the first embodiment of the present invention.
Figure 4:
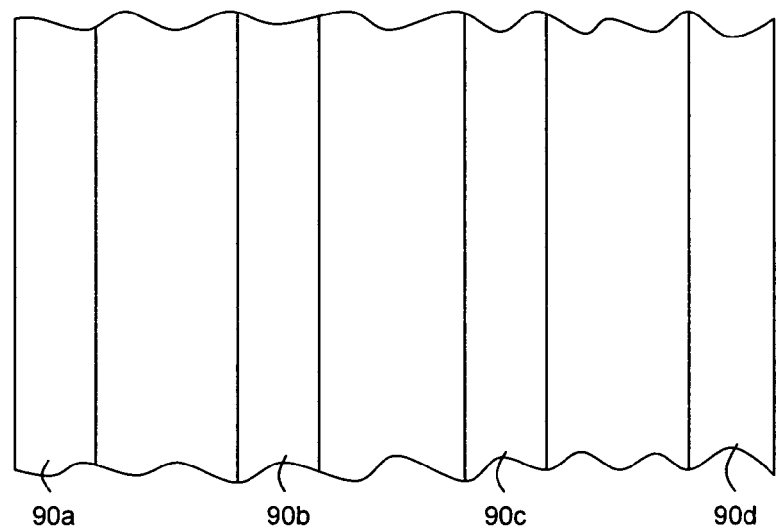
FIG. 4 is a plan view of the structure of FIG. 3 after masking and etching according to the first embodiment of the present invention.

Referring to FIG. 3, a protective oxide layer 88 may be disposed on the silicon carbide layer 86 followed by a deposition of a silicon nitride layer 90. Referring to FIG. 4, the silicon nitride layer 90 may be masked to define a plurality of spaced-apart, elongated, parallel rows, illustrated by the silicon nitride lines 90a–90d. The underlying silicon carbide layer 86 may be etched in alignment with the silicon nitride lines 90a–90d. The resultant structure from this etching is shown in the plan view of FIGS. 5 and 6, which may result in a plurality of parallel silicon carbide lines (i.e., semiconductor lines), illustrated by silicon carbide lines 86a, 86b, 86c and 86d.

Referring to FIG. 5, for the most part, the described processing covers the fabrication of a memory array 92 for memory cells. While the memory array 92 is fabricated on a section of the SiC-on-insulator wafer, the peripheral circuits 58 of FIG. 2 for the memory cell may be fabricated on other sections of the wafer. The memory array 92 is shown having two sections: an array section 94 formed on the oxide layer 84 and shown to the left of the dotted line 96 and a logic section 98 also formed on the oxide layer 84 and shown to the right of the dotted line 96. Hence, some of the processing for fabricating the memory array section 94 also may be used for simultaneously fabricating the peripheral circuits in the logic section 98. For instance, when the silicon nitride layer 90 is etched, various features may be defined in the logic section, such as shown by the nitride member 90e. Then, when the layer 86 is etched, it is etched both in the array and logic section forming, for example, a member 86e.

At times it may be desirable to perform separate processing on one of the two sections 94 and 98. FIGS. 5 and 6 illustrate such processing. With respect to FIG. 5, after the silicon carbide layer 86 is etched, the entire memory array 92 may be covered with a protective oxide 100. Then, a photoresist layer 102 may be formed over the array section 94, leaving exposed the logic section 98. The removal of silicon nitride on silicon carbide in the logic area 98 may be accomplished in several ways. CVD-deposited silicon nitride may have a much faster etch rate than crystalline silicon carbide in hot phosphoric acid. The oxide 100 in the logic area 98 may be removed, followed by the resist 102 removal and silicon nitride removal in the logic area 98. An alternative way may be to apply dry etch to the protective oxide 100 layer with the resist 102 protecting the array area 94. The dry etch may expose the silicon nitride and leave a side wall spacer to protect the silicon carbide in the logic area 98. Next, the resist 102 may be removed and hot phosphoric acid may be used to remove silicon nitride without attacking the silicon carbide body. The remaining oxide spacer on the sidewall may be removed by the wet etch used to clear the protection oxide in the array region post silicon nitride removal. Note that in FIG. 6, the oxide layer 84b is somewhat thinner than the oxide layer 84a. This may occur because of the additional etching needed to remove the silicon nitride from the logic section 98. This also may cause some undercutting under the member 86e. Consequently, while the memory is fabricated, processing may occur in one or both sections 94 and 98. The processing in the logic section 98 for the input/output (I/O) data buffers, address buffers, sensing amplifiers, refresh amplifiers, address decoders and other circuitry needed to support the array section 94 of a DRAM memory is not described. Typical processing steps, such as well implants, sacrificial oxidizing, various cleaning steps, including gate oxide pre-cleaning, are not shown or discussed for either section of the memory.

Figure 7:
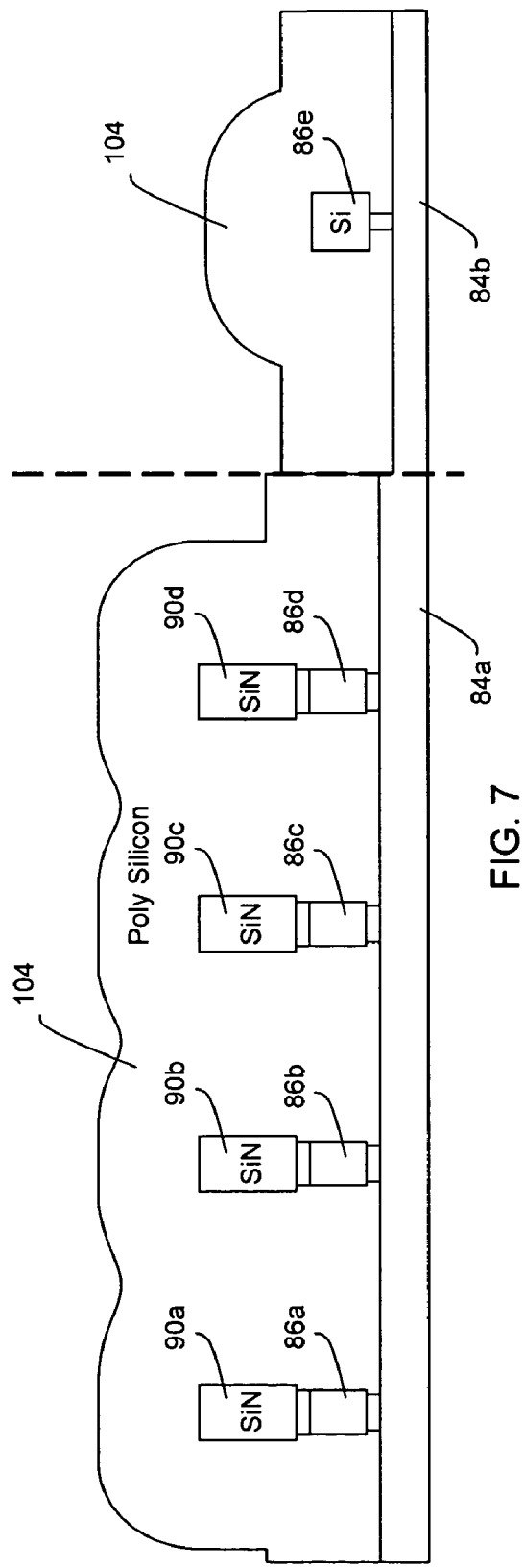
FIG. 7 illustrates the structure of FIG. 6 after the deposition of a polysilicon layer according to the first embodiment of the present invention.

Referring to FIG. 6, after the gate oxide pre-cleaning, a gate oxide layer (not shown) may be grown on the exposed silicon carbide. In the array section 94, the gate oxide may be grown on the sides of the silicon carbide lines 86a–86d. The top surface of these lines 86a–86d may be covered with silicon nitride lines 90a–90d. This gate oxide may be relatively thin and is not shown in the FIG. 6. Referring to FIG. 7, following the gate oxide formation, a polysilicon layer 104 may be formed over the entire substrate. As shown in FIG. 7, some undercutting may have occurred under the lines 86a–d due to the sacrificial oxide removal and the gate oxide pre-cleaning. This polysilicon layer 104 may be planarized. This planarization may occur to at least the tops of the silicon nitride lines 90a–90d or slightly below these lines to reduce any stringers or bridges the polysilicon may have over the silicon nitride. If such stringers or bridges occur, parasitic paths may be created that short the front and back gates of a memory cell. The planarization of the layer 104 may be done with either chemical mechanical polishing (CMP) or with a chemical planarization process. In one embodiment, an oxide may be deposited to provide a general level polishing surface between the array and logic sections. In another embodiment, the resist may be patterned to cover the logic section, followed by a dry etch process to remove polysilicon in the array down to the level slightly below the upper surface of silicon nitride lines 90a–90d. For this option, a polysilicon spacer may be formed between the logic and array section. This spacer may have no impact on the functionality of the circuits.

Figure 8:
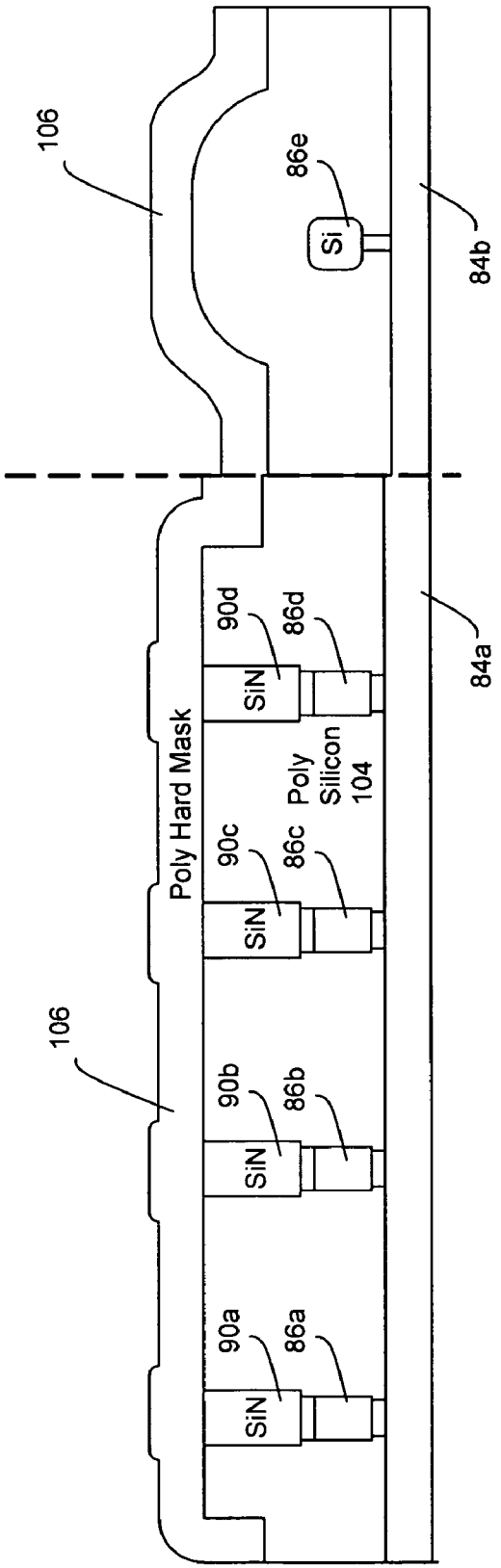
FIG. 8 illustrates the structure of FIG. 7 after the planarization of the polysilicon layer and the deposition of a hard mask layer according to the first embodiment of the present invention.
Figure 9:
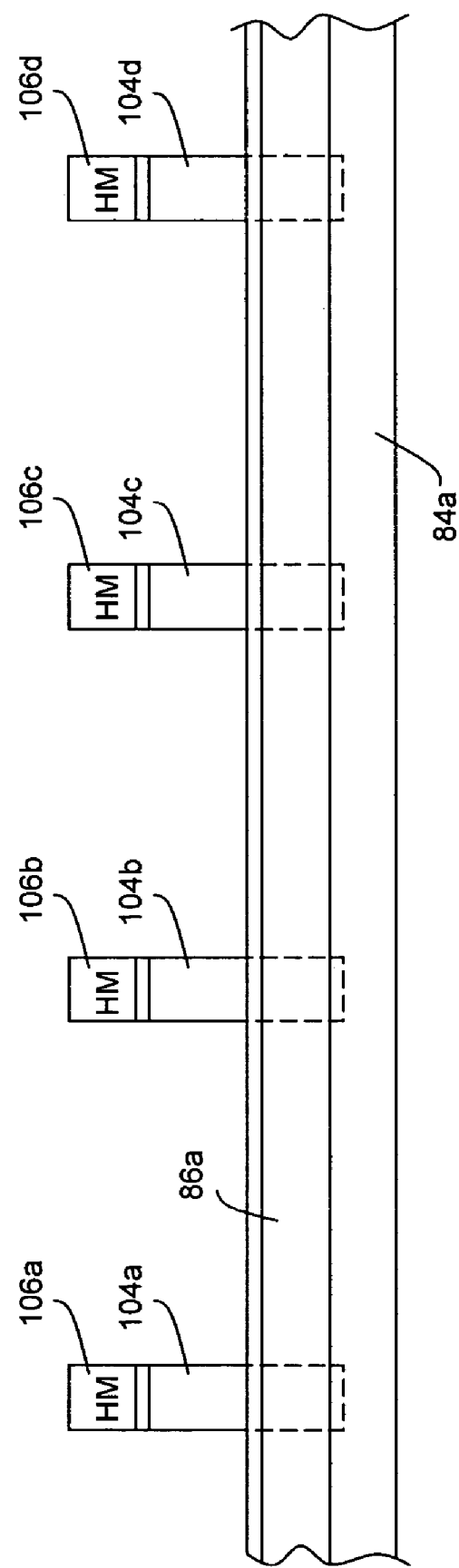
FIG. 9 illustrates the structure of FIG. 8 after etching of the polysilicon layer to define gates in the array according to the first embodiment of the present invention.

Referring to FIG. 8, a poly hard mask 106 may be applied to allow patterning of the polysilicon 104. As with FIGS. 5–7, the cross section of FIG. 8 is taken so as to traverse a plurality of silicon carbide lines 86a–d. The portions of the silicon carbide lines 86a–d traversed correspond to the body regions of the memory cells. Referring to FIG. 9, the mask 106 may define a plurality of spaced-apart parallel gate lines, which are illustrated by the four gate lines 104a–d. The gate lines may be edged in alignment with the hard mask lines, which are illustrated by hard mask lines 106*a–d*. The cross-sectional view of FIG. 9 is substantially perpendicular to the cross sectional views of FIGS. 5–8, so as to traverse the plurality of gate lines 104*a–d*. The cross-section of FIG. 9 is selected to run along the silicon carbide line 86*a*. In other words, the gate lines 104*a–d* may be disposed generally perpendicular to the silicon carbide lines 86*a–d*, as is more clearly shown in FIG. 10.

Figure 10:
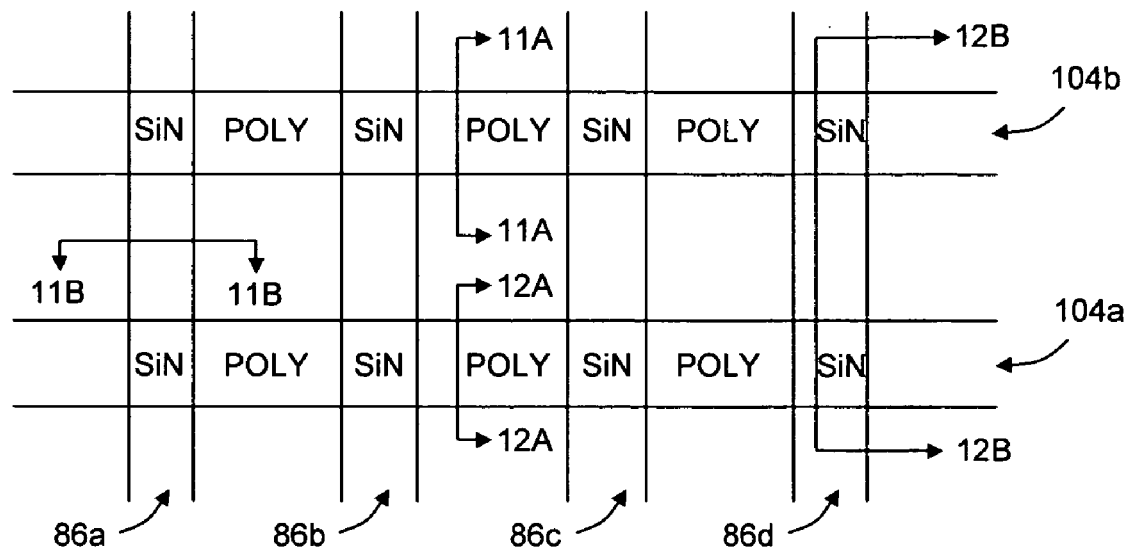
FIG. 10 is a plan view of a portion of the array of FIG. 9 according to the first embodiment of the present invention.

As shown in FIG. 10, the gate lines 104*a–d* may be interrupted at the intersection of the stack of silicon carbide lines 86*a–d*. In other words, each of the gate lines 104*a–d* does not form a continuous line like the silicon carbide lines 86*a–d*. The gate lines 104*a–d*, as mentioned above, may form the front and back gates of the memory cells. As shown in FIG. 10, the silicon nitride lines atop the silicon carbide lines may be removed between the gate lines. This may be done now or earlier in the processing. The remaining silicon nitride (SiN) may remain above the silicon carbide body regions (between source and drain regions) of the silicon carbide lines to assure that the front and back gates of each memory cell remain insulated from one another.

Figure 11A:
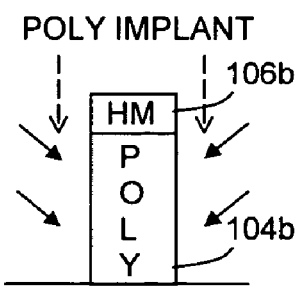
FIG. 11A is a cross-sectional, elevation view of the structure of FIG. 10 taken through section line 11A—11A of FIG. 10, illustrating ion implantation according to the first embodiment of the present invention.
Figure 11B:
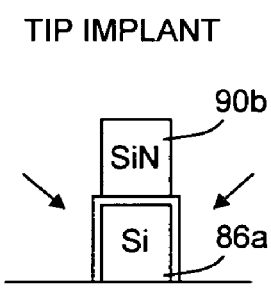
FIG. 11B is a cross-sectional, elevation view of the structure of FIG. 10 taken through section line 11B—11B of FIG. 10 illustrating tip implantation according to the first embodiment of the present invention.

Referring to FIG. 11A, next doping through implantation of the gate lines (illustrated by line 104*b*) may be undertaken to form a polysilicon implant, where the ion implantation may be undertaken at an angle (illustrated by solid arrows) or vertically (illustrated by dashed arrows). The vertical implant may reduce short channel effect but may require higher implant energy to penetrate the hardmask. If a metal gate is used, there may be no need for this implant. For the n-channel embodiment previously described for the memory cell, an N-type dopant, such as arsenic, may be used to dope the polysilicon to a relatively high doping level so that it is sufficiently conductive. Referring to FIG. 11B, next a tip implant for forming extensions of the source and drain regions may be undertaken into the sides of the silicon carbide lines 86*a–d* between the cell body regions. This also may be undertaken at an angle as shown by the arrows; however, in a different direction than the polysilicon implant. Note that in FIG. 11B that the silicon nitride line 90*b* has not yet been removed, which may be removed before or after the tip implant, as previously discussed. This tip implant may be relatively lightly doped with an N-type dopant. Also, if desirable, a halo implant may be undertaken, which may be angled-in under the silicon nitride lines covering the cell body regions.

Figure 12A:
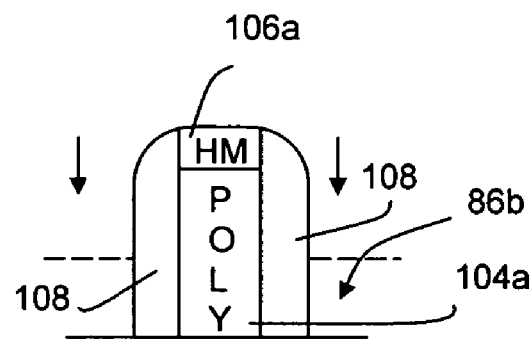
FIG. 12A is a cross-sectional, elevation view of the structure of FIG. 10 after spacers have been formed on the polysilicon gates and during source/drain doping according to the first embodiment of the present invention. This

Referring to FIG. 10, a silicon dioxide or silicon nitride layer may be formed over the memory array and may be etched, for example, with an anisotropic etchant to form spacers on the sides of the gate lines 104*a–d*. The cross sectional views of 12A—12A in FIG. 10 are taken after this layer is formed over the memory array and has been etched to form spacers. Referring to FIG. 12A, the spacers 108 are shown on the side of the gate line 104*a*, with the silicon carbide line 86*b* in the background. The hard mask line 106*a* may remain on top of the gate line 104*a*. Referring back by to FIG. 10, another ion implantation process may be used to dope the silicon carbide lines between the spacers to form the main source and drain regions for the memory cells. This is a relatively high level doping implantation with an N+ type dopant for a P channel cell, with the source and drain regions being formed in the originally P-type doped silicon carbide layer 86.

Figure 12B:
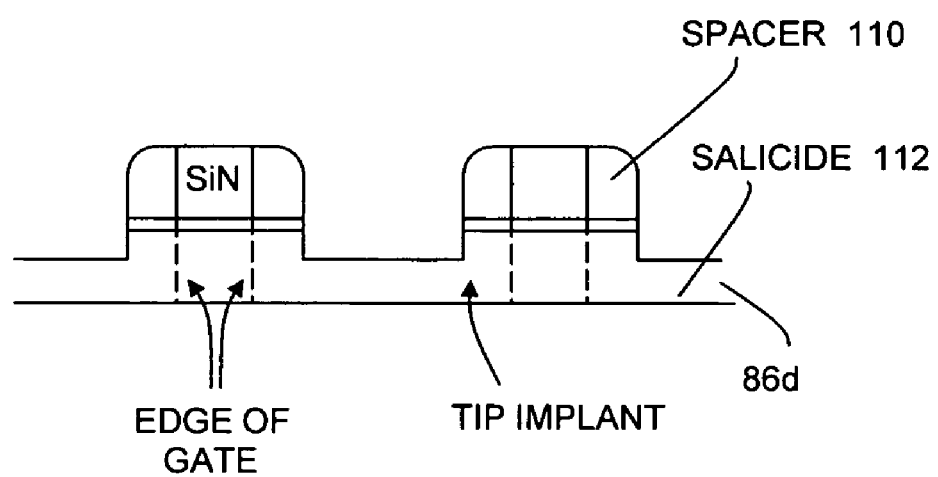
FIG. 12B is a cross-sectional, elevation view of the structure of FIG. 10 taken through section line 12B—12B of FIG. 10 after silicide is formed according to the first embodiment of the present invention.

Referring to FIG. 12B, a cross section is taken along the silicon carbide line 86*d* in FIG. 10 after spacers 110 have been formed adjacent the silicon nitride portions remaining over the silicon carbide body regions. Following the source/drain formation, a self-aligning silicide (salicide) layer 112 may be used to reduce the resistance of the exposed silicon carbide line 86*d* (silicon nitride between gate lines have been removed), which includes the source and drain regions of the memory cells. The edges of the gates behind the silicon carbide line 86*d* are shown in dashed lines and the area of the tip implant is also shown. In one embodiment, if the hard mask used to etch the polysilicon may have a thickness equal to or slightly less than the silicon carbide body regions, then the upper surface of the gate lines also may be silicided. In another embodiment, if the hard mask is chosen to be thicker, the array polysilicon may be non-silicided for self-aligned contact.

Figure 13:
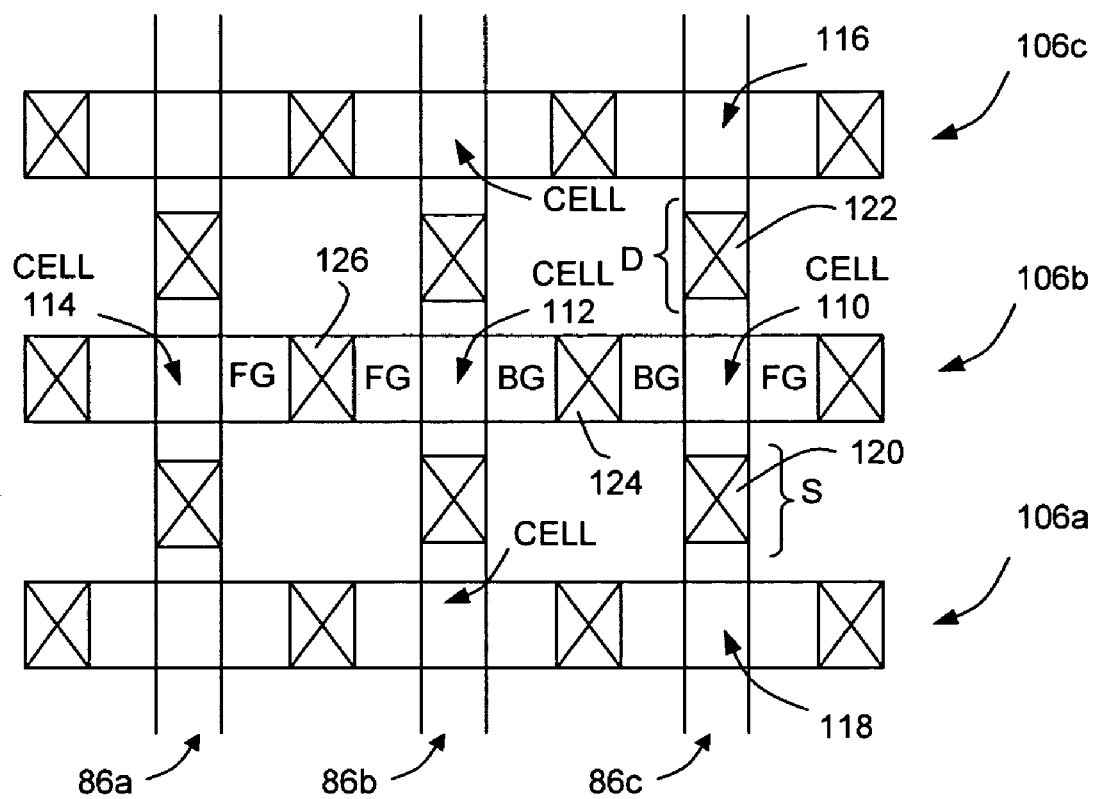
FIG. 13 is a plan view of the memory array used to illustrate the metal contacts made to the array according to the first embodiment of the present invention.

Referring to FIG. 13, a plan view of portion of the memory array is shown with the silicon carbide lines 86*a*, 86*b* and 86*c*, and the hard mask lines 106*a*, 106*b* and 106*c*. The hard mask and gate lines, as previously mentioned, are disconnected lines, interrupted at the silicon carbide lines. Several cells are illustrated at the intersection of these lines such as cells 110, 112, and 114 in the silicon carbide lines 86*c*, 86*b*, and 86*a* and cells 116, 110 and 118 along the silicon carbide line 86*c*. A contact is made to each of the source and drain regions in the array and each of the front gates and back gates in the array. While each cell may be a four terminal device, in fact, in the central portion of the array, since contacts are shared, the number of contacts may be equal to half the number of cells. For instance, for cell 110, a contact 120 contacts the source region for this cell. This contact also may provide a source region contact for the cell 118. Similarly, the contact 122 contacting the drain region of cell 110 may provide a drain region contact for the cell 116. Likewise, the gate contacts are shared. For instance, the back gate for both cells 110 and 112 may be the single contact 124. Similarly, the front gate contact 126 may provide the front gate control for both the cells 112 and 114. All the contacts shown in FIG. 13 may extend upward to one of a plurality of metal layers where they terminate in an overlying horizontal metal line or bridge.

Figure 14:
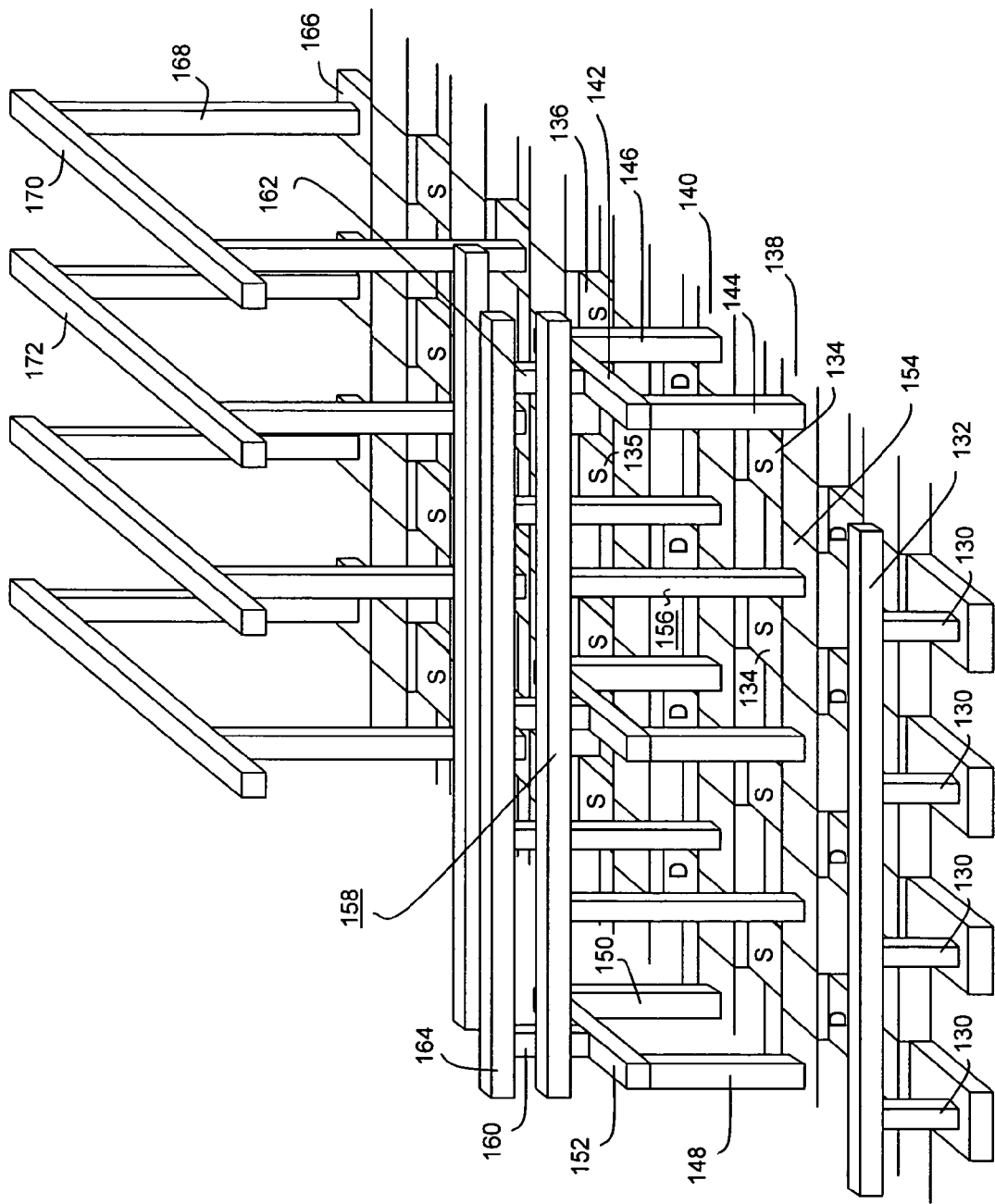
FIG. 14 is a perspective view of the memory array used to illustrate metal contacts in overlying metal lines at several levels according to the first embodiment of the present invention.

Referring to FIG. 14, in one embodiment four layers of metal may be used to provide access to the cells in the array. For this embodiment, all the source regions may be connected to conductive lines in a first metalization layer. Several contacts to source regions 130, along one line of the array, are shown connected to an overlying metal line 132 formed in the first level of metalization. The other source regions also may be coupled to conductive lines such as line 132; however, they are not shown in FIG. 14 in order not to overly complicate this FIGURE. For instance, the source regions 134 and the other source regions along this line also may be coupled to a line (not shown) parallel to line 132 in first level of metalization. Similarly, the source regions 136 also may be coupled to another conductive line (not shown). In this embodiment, these conductive lines may be connected to ground potential, as shown in FIG. 2. In a second level of metalization, all the back gates may be first paired with short lines or bridges which extend between adjacent back gate contacts. For instance, the back gate 138 and the back gate 140 may be connected to the bridge 142 through the contacts 144 and 146, respectively. These contacts extend from the array to the second level of metalization. Similarly, the other back gates along this line also may be connected by bridges as shown by contacts 148 and 150, which are interconnected by the bridge 152. The other back gates in the array may be paired in a similar manner. In a third level of metalization, the front gates may be connected to conductive lines, for instance, a front gate 154 may be connected by a contact 156 to a line 158. Similarly, other conductive lines may be defined in this third level of metalization and receive the contacts from the other front gates. These lines in the third level are the word-lines of the memory. Beginning with the second level of metalization and extending to the third level of metalization, contacts such as 160 and 162 may be formed midway between the ends of the bridges 142 and 152. These contacts extend up to the third level of metalization to contact a conductive line 164 formed in the third level of metalization. Likewise, the other bridges contacting the other back gates may be brought up to this level and connected to lines, such as the conductive line 164. These lines may be connected to a biasing source. In a fourth level of metalization, the drain regions may be connected to lines. For example, the drain region 166 may be connected through a contact 168 to a line 170. The contact 168 may extend from the drain region in the array to the fourth level of metalization. Similarly, all the other drain regions may be connected to conductive lines, such as lines 170 and 172. For instance, the drains may be connected to bit lines at the first level of metalization and the sources may be connected to the grounding lines in the fourth level of metalization.

Figure 15A:
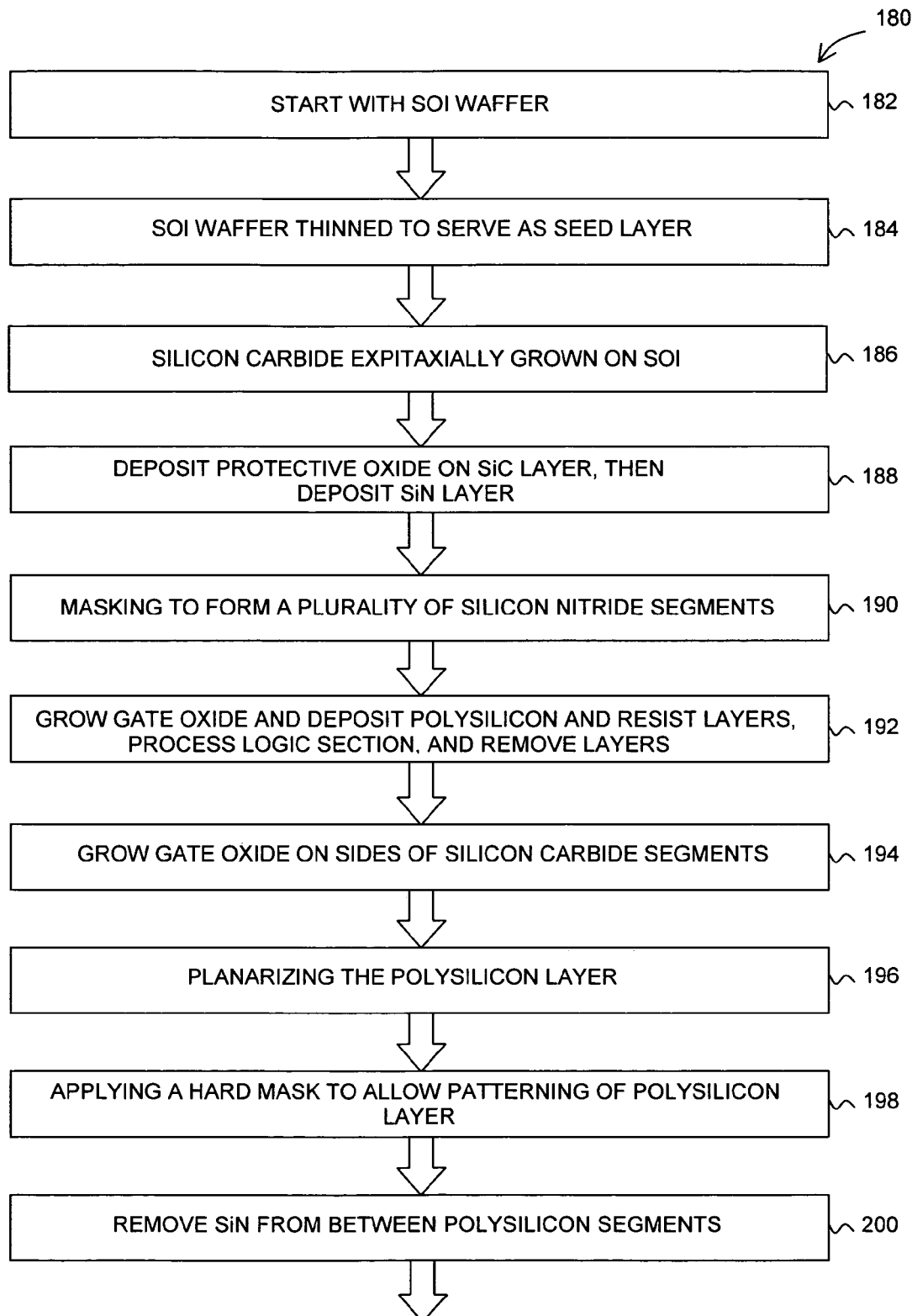
FIG. 15 (divided over FIGS. 15A and 15B) is a flow chart of a process flow to fabricate a split-gate, floating body memory cell according to the second embodiment of the present invention.
Figure 15B:
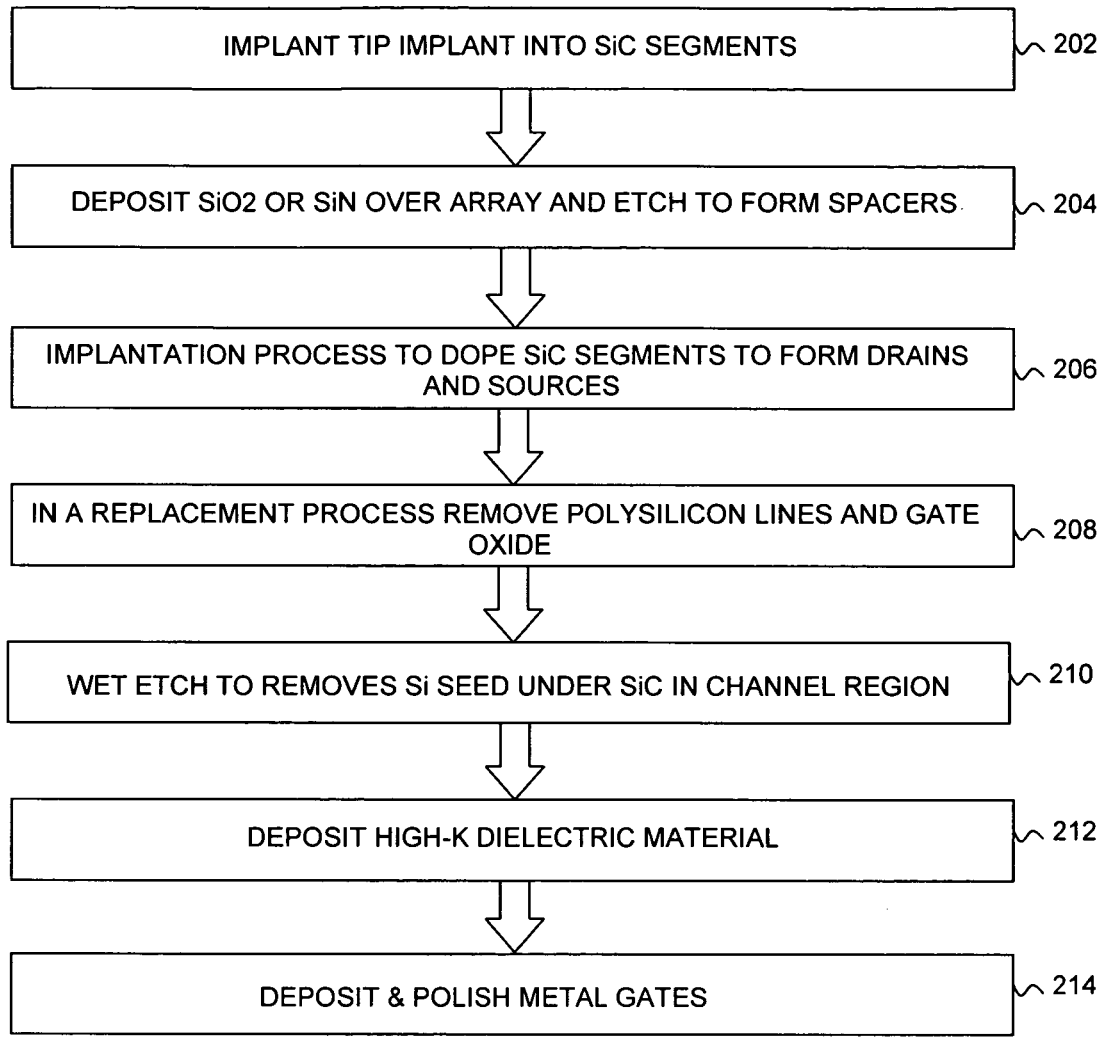

A split-gate floating-body memory cell, in accordance with the second embodiment of the present invention, is based upon silicon carbide-on-silicon (SiC-on-Si). Referring to FIG. 15 (broken into FIGS. 15A and 15B), a process flow 180 for fabricating the memory cell is shown, in accordance with one method of the present invention. At stage 182, the process flow 180 may start with a silicon-on-insulator (SOI) wafer formed, for example, by use the previously mentioned SIMOC (Separation by Implantation of Oxygen) process or the BESOI (BondEd SOI) process. In SIMOC process, high-energy ion-implantation may be used to place oxygen atoms in a layer below the surface of a lightly doped silicon wafer. Following implantation, the wafer may be annealed at elevated temperature to produce the buried oxide layer below the oxide surface, so as to leave a thin layer of silicon above the buried oxide layer. Alternatively, the BESOI process may use silicon wafer-to-wafer bonding. A silicon wafer may be oxidized to form the oxide layer. A second silicon wafer may put in contact with the oxidized surface and annealed at elevated temperatures to form a bond. Hence, a silicon-on-insulator (SOI) wafer may be generated at this stage 182 of the process flow 180.

At a stage 184, the upper silicon layer of the SOI wafer may be thinned down to serve as a seed layer for silicon carbide growth. Thinning may be accomplished by chemical etching to reach the desired silicon layer thickness. Alternatively, mechanical lapping and polishing processes may be used to thin the upper silicon layer of the SOI wafer. The silicon seed layer may be around 5–10 nm thick for sub-100 nm devices. At a stage 186, the silicon carbide may be expitaxially grown on SOI wafer so to provide a silicon carbide layer on top of the SOI wafer.

After the silicon carbide growth, the fabrication process 180 may be the same as that described for the first embodiment in FIGS. 4–15 (the first embodiment being based upon the SiC-on-insulator material), with some modifications to be described hereinafter. First, the portion of the fabrication process 180 which is the same for the first and second embodiments is described. The common fabrication stages of FIGS. 4–15 may be summarized as follows, such steps being applicable both to the first embodiment (SiC-on-insulator) and this second embodiment (SiC-on-Si). At a stage 188, a first protective oxide may be deposited on the silicon carbide layer, followed by a deposition of a silicon nitride layer. At a stage 190, the silicon nitride layer may be masked to form a plurality of silicon nitride lines, which may be used to etch the silicon carbide layer to form a plurality of silicon carbide lines under the plurality of silicon nitride lines. At a stage 192, the memory array section may be covered first with a protective oxide layer and then with a photoresist layer during processing of the logic section, after which the protective oxide and photoresist layers may be removed. At a stage 194, a gate oxide may be grown on the sides of the silicon carbide lines and a polysilicon layer may be formed over the entire substrate. At a stage 196, the polysilicon layer may be planarized. At a stage 198, a hard mask may be applied to allow patterning of the polysilicon layer, resulting in etching of a plurality of gate lines with the hard mask lines on top of the gate lines. At a stage 200, the silicon nitride atop the silicon carbide lines may be removed between the gate lines. At stage 202, a tip implant may be implanted in the silicon carbide lines, but unlike with the first embodiment, with the second embodiment the gate lines do not need to be doped because the gate lines are going to be replaced. At stage 204, a silicon dioxide or silicon nitride layer may be formed over the array and may be etched to form spacers on the sides of the gate lines. At stage 206, another ion implantation process may be used to dope the silicon carbide lines to form the main source and drain regions.

At this point in the flow process 180 for the second embodiment, after the gates and spacers are formed, the flow process differs from that for the first embodiment. After the gates and spacers have been formed, a replacement process may be applied to remove the gate lines and the gate oxide layer and to replace them with a metal gate and a high-k dielectric gate material, respectively. At a stage 208 of the replacement process, the gate lines and gate oxide layer may be removed. Prior to depositing the metal gate and the high-k dielectric gate material, at stage 210, a wet etch may be used to remove the silicon seed layer under the silicon carbide line. Silicon carbide is known to be stable against wet etch at room temperatures. A selective wet etch for silicon may be accomplished with a Potassium Hydroxide (KOH) etch. Only silicon in the channel or body region may be removed as the silicon elsewhere may be covered by a patterned oxide used by the replacement process. After the removal of silicon seed layer, at a stage 212, the high-k dielectric material may be deposited to fill an undercut under the silicon carbide lines and to form a gate insulator along the lateral walls of the metal front and back gates between the silicon carbide lines and the gates. High-k dielectric materials such as hafnium oxide (HfOx) with atomic layer deposition technique may have excellent gap fill property. At a stage 214, the metal gates may be deposited and polished after the high-k dielectric deposition. The silicon seed layer thickness may be around twice the thickness of high-k gate dielectric material so that the undercut region may be filled with the high-k material to isolate the metal gates on the two sides of the active region of diffusion in the silicon carbide lines. The silicon seed layer may be around 5–10 nm thick for sub-100 nm devices.

Figure 16:
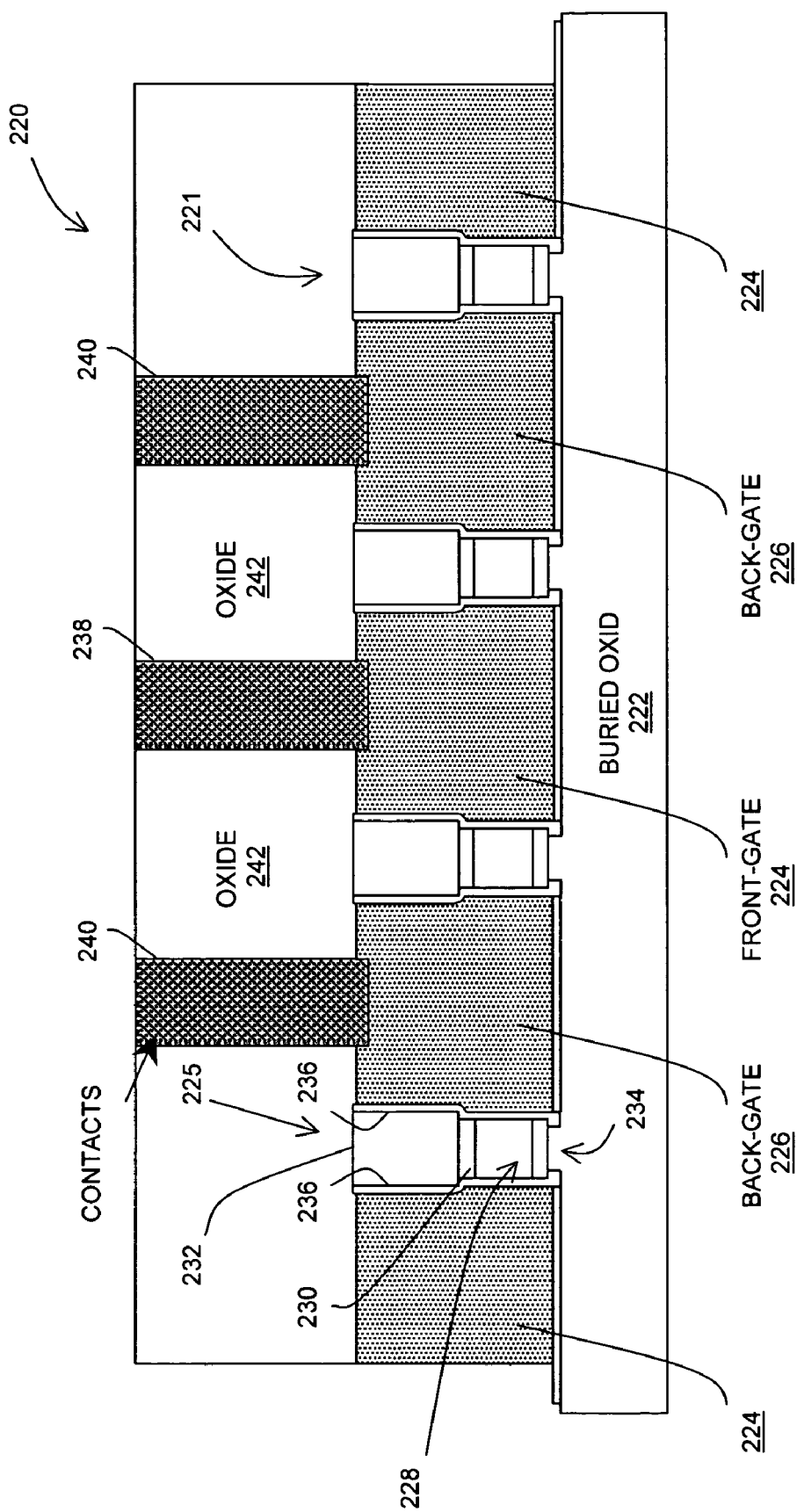
FIG. 16 is a cross-sectional view of a memory array according to the second embodiment of the present invention.

Referring to FIG. 16, a memory array 220, according to the second embodiment of the present invention, is shown. This memory array 220 may be fabricated by the flow process 180 of FIG. 15. The cross-section of FIG. 16 is taken along a gate line, with this cross-section traversing a plurality of body regions of a plurality of memory cells 221 of the array 220. The body regions are disposed in interrupting relationship with gate lines. The memory array 220 may have a buried oxide layer 222 on top of a silicon substrate (not shown), with alternating front and back gates 224 and 226 being formed on the layer 222. Between the adjacent pairs of the front and the back gates 224 and 226 there are stacks 225 which each include a body region 228 of a silicon carbide line, a protective oxide layer 230 and a silicon nitride line 232. At the bottom of this stack 225 there is a layer 234, formed of a high-k dielectric material, that replaces the silicon seed. Each side of the front and back gates 224 and 226 may have a gate insulation layer 236, also formed of the high-K dielectric material, which is interposed between the gates and the stack. Each gate 224 and 226 may have a contact 238 or 240, respectively. An oxide 242 is disposed between the contacts. In the fabrication process, the oxide 242 may be deposited and then the oxide 242 may be etched for the contacts 238 and 240.

The second embodiment, based upon SiC-on-Si, may have lower material costs compared to a single silicon carbide crystal of the first embodiment. High temperature processing may often be required for silicon carbide devices. Although defects may degrade the performance of SiC-on-Si embodiment relative to silicon carbide crystal embodiment, the leakage may still be substantially lower than silicon at high temperatures. The low leakage may provide improved margins for retention time due to device scaling and high temperatures. However, oxide breakdown field may be lowered by a factor of 2 and the junction leakage may be many orders of magnitude higher than the silicon carbide single crystal. In the second embodiment, this issue may be dealt with by using new gate materials such as the high-k dielectric gate material for the layers 234 and 236. Despite the degradation compared to silicon carbide crystal, the junction leakage of SiC-on-Si may be slightly better than silicon crystal at room temperature and may be 2 orders of magnitude lower than the silicon at 110 C. The low leakage compared to silicon may provide the solution for improved retention time due to device scaling and high temperatures.

The third embodiment according to the present invention is directed toward a backgateless floating body cell for a memory array. Silicon carbide may be epitaxially grown on SOI with a relatively thicker silicon seed layer compared to the second embodiment described above. The thicker seed layer serves as the floating body for charge storage, eliminating the need for the back gate provided with the second embodiment. As previously mentioned, removal of the bias source and the embedded back gate in FIG. 2 makes circuit diagram of FIG. 2 applicable to and descriptive of this third embodiment. The backgateless memory cell eliminates the back gate and therefore the contact for the back gate. Without the back gate contact, the cell area may be reduced.

Figure 17:
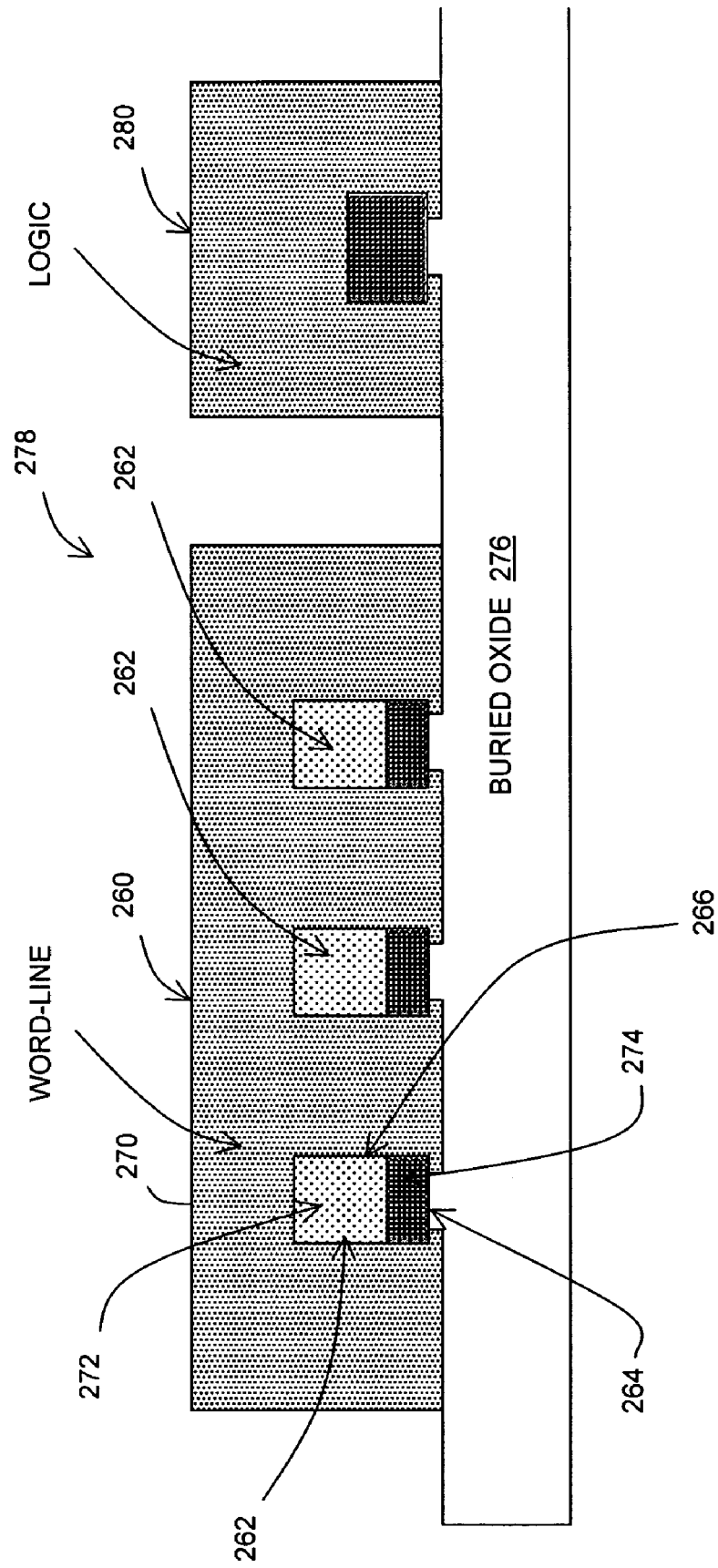
FIG. 17 is a cross-sectional view of a memory array according to a third embodiment of the present invention.

Referring to FIG. 17, there is illustrated a cross-sectional view of a memory array 260 incorporating the backgateless transistor or memory cell, according to the third embodiment of the present invention. Each of a plurality of parallel semiconductor lines 262 may include a silicon line 264 and a silicon carbide line 266 on top the silicon line 264, with the silicon carbide line 266 including the sources, drains, and body regions with the channel. The cross-sectional view of FIG. 17 traverses the array 260 at body regions of the individual cells that are aligned along one of a plurality of parallel conductive gate lines 270 (only one shown), which form a plurality of word-lines. The gate lines 270 may be made of polysilicon. Like the first two embodiments, the plurality of silicon carbide lines 266 are disposed perpendicular to the plurality of gate lines 270. However, in this third embodiment, the gate lines 270 may be continuous and are not divided up into separate front and back gates. Since there is only one type of gate in each conductive gate line, each gate line 270 comprises one of the word-lines. At the intersection with the gate lines 270, each of the silicon carbide lines 266 may have a silicon carbide body region 272 and each of the silicon lines 264 may have a silicon region 274 under the body region 272. Moreover, each of the gate lines 270 may extend downward along opposed sides of the regions 272 and 274 to be positioned adjacent to both the silicon carbide body region 272 and the silicon region 274. The semiconductor lines 262 may be formed on a buried oxide layer 276. A tip, a source and a drain implant (not shown) of the memory array 260 may be undertaken vertically into the semiconductor lines 262 to ensure that the source-drain (SD) junctions stay within the silicon carbide lines 266 in order to minimize the junction leakage. As with the first and second embodiments, in addition to an array section 278, there is a logic section 280.

Figure 18:
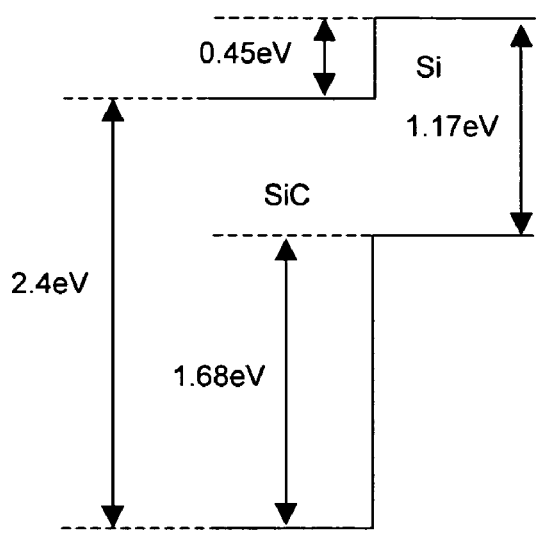
FIG. 18 is a diagram of a band alignment between a silicon carbide layer and a silicon layer of the memory cell according to the third embodiment of the present invention.
Figure 19:
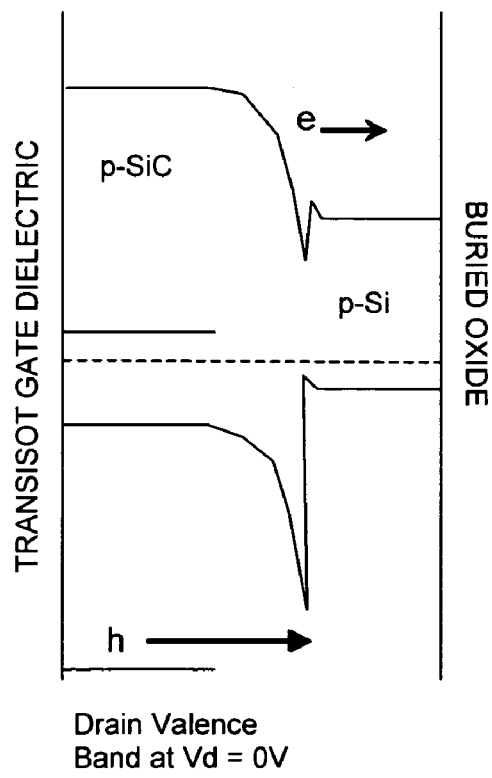
FIG. 19 is a band diagram for the memory cell according to the third embodiment of the present invention.

With respect to operation of the memory array 260, the operation may be the same as that of the floating body memory cell described with respect to FIG. 2. Band alignment between the silicon carbide lines 266 and the silicon lines 264 is illustrated in FIG. 18 and a band diagram for dopant profiles is illustrated in FIG. 19 to show how each of semiconductor lines 262 at each of the gate lines 270 functions without a back gate. In the first and second embodiments, the back gate of a floating body transistor or memory cell creates a potential where holes can accumulate. For NMOS embodiment of the memory cell, for example, a negative voltage may be applied to lower the potential in the body regions. The lowered body potential results in valence band bending upward to create a region for hole storage. In the third embodiment, the junction between the silicon carbide body region 272 and silicon region 274 defines a heterojunction between different semiconductor materials. This heterojunction may create a similar effect to that of the first two embodiments and may eliminate the need for a back gate. Referring to FIG. 18, the conduction band of silicon may be 0.45 eV higher than that of the 3C-SiC and the valence band may be 1.68 eV higher. This band-alignment may attract holes toward the silicon and repel electrons toward silicon carbide, similar to what a back gate would do in the floating body transistor of the first two embodiments. Hence, the silicon of the SiC-on-Si structure may serve as the floating body for charge storage, eliminating the need for the back gate. However, a high voltage operation may be required to overcome the high band discontinuity when writing a "1".

Figure 20:
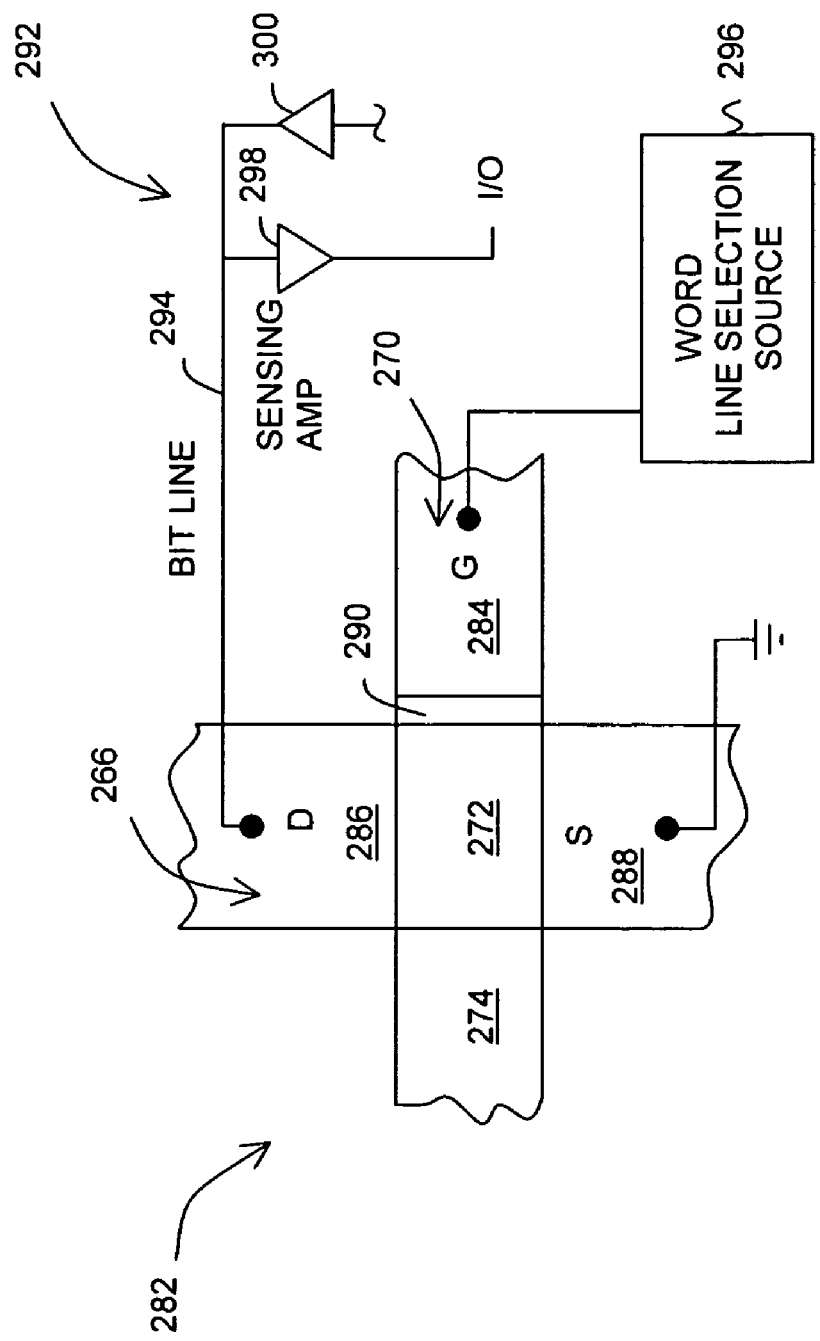
FIG. 20 is a circuit schematic for the memory cell according to the third embodiment of the present invention.

Referring to FIG. 20, a schematic circuit diagram is shown of a floating-body memory cell 282 of the memory array 260 of FIG. 17 in accordance with a third embodiment of the present invention. A plurality of the memory cells 282 forms the memory array 260 of FIG. 17. Each memory cell 282 may have its body region 272 located at the intersection of one of the semiconductor lines 266 and one of the gate lines or word-lines 270. A portion of the gate line 270 which surrounds the body region 272 on three sides defines a gate 284, with there being a sole gate for each memory cell 282, unlike the first two embodiments. Although the gate 284 is shown only on one side of the silicon carbide body region 272 in FIG. 20, it also extends along opposed sides of the portions 272 and 274 as shown in FIG. 17. In FIG. 20, a portion of one of silicon carbide lines 266 is shown in FIG. 20 forming the cell 282, with this portion including a drain region 286, a source region 288, and the silicon carbide body region 272 interposed between the drain region 286 and the source region 288. In one embodiment, the silicon carbide body region 272 may be a P-type region, and the source region 288 and drain region 286 may be more heavily doped with an N+ type dopant. The gate 284 may be a metal gate insulated from the body region 272 by a high-k dielectric 290. The memory cell 282 may be a three-terminal device, coupled to the peripheral circuits 292 of the memory cell. For the n-channel embodiment illustrated, the source region 288 may be coupled to ground. A terminal of the drain region 286 may be connected to a bit line 294 in the memory. The gate 284 forms part of one of the gate lines or word-lines 270 in the memory cell 282 to allow selection of the memory cell. A word-line selection source 296 may provide a voltage which selects the word-line 270. The peripheral circuits 292 may include a sensing amplifier 298 and a bit line driving amplifier 300, with the sensing amplifier 298 being attached to the same circuitry as described with respect to the sensing amplifier 70 of FIG. 2. The memory cell 282 may be a dynamic, random access memory cell, and as such, the data stored requires periodic refreshing.

As previously describe, each of the gates 284 of gate lines or word-lines 270 may be mounted adjacent to both the silicon carbide body region 272 (includes the channel) and the silicon region 274, but separated by the high-k dielectric 290. In one embodiment, to write "0," the gate line 270 may be biased at a positive voltage by the word-line selection source 296 and the drain region 286 may be biased at a negative voltage by the bit line driving amplifier 300 to push holes in silicon region 274 toward the drain region 286. A high voltage drop (>1.7V) from the gate line 270 to drain region 286 may overcome the hole barrier height between the silicon carbide and the silicon. During the write "1" operation, the gate line 270 and drain region 286 both may be biased at a positive voltage to generate electron-hole (e-h) pairs with impact ionization. Alternatively, gate induced drain leakage may be applied to the single gate device by applying a negative gate voltage. To facilitate efficient e-h generation, higher dopant concentrations and higher voltages may be used as compared those used for to silicon. The high voltage also may provide enough energy for holes to overcome the barrier at the interface of the silicon carbide and the silicon.

Figure 21:
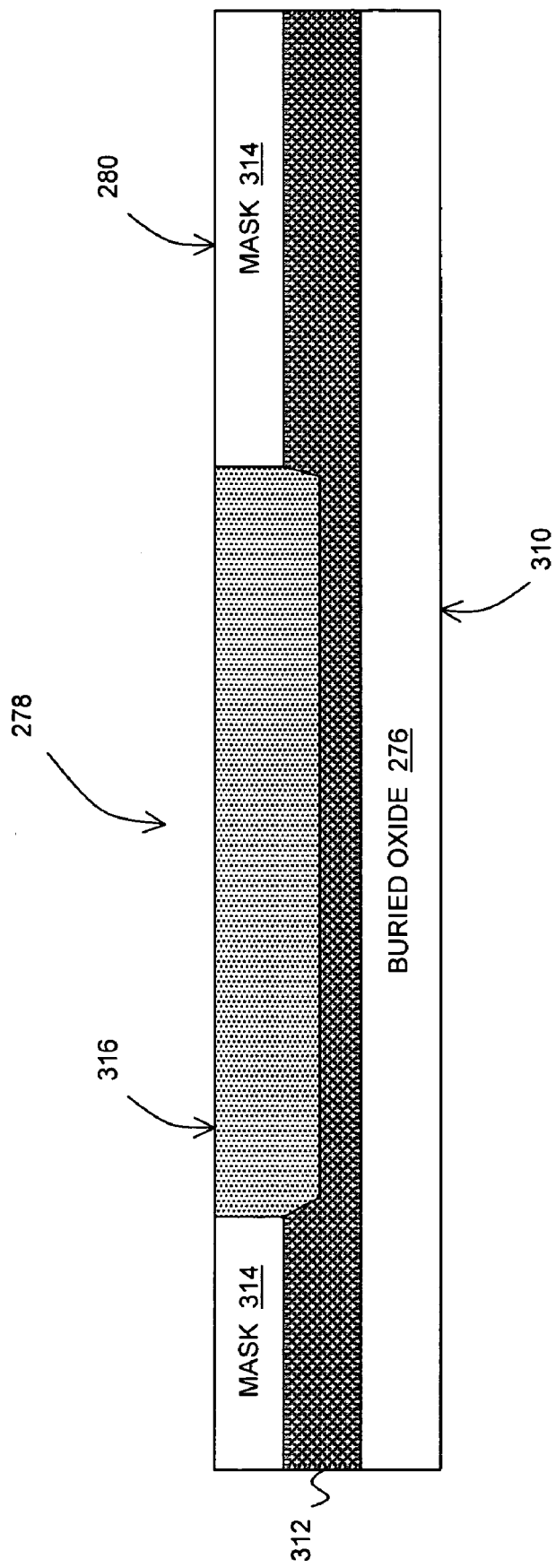
FIG. 21 is a cross-sectional view of a wafer after a silicon carbide layer has been grown on a silicon layer for the third embodiment of the present invention.

With reference to FIG. 21, the fabrication process of the third embodiment may start with an SOI wafer 310 with a proper thickness of silicon layer. The SOI wafer 310 may be fabricated with a thinner silicon layer 312 in the array section 278, if it is desirable to have thinner silicon body in the array section 278 than in the logic section 280 for the logic/periphery devices. A suitable silicon carbide implant in the silicon layer 312 for the memory cell may be undertaken with use of a mask layer 314. After depositing the mask 314, an expitaxial silicon carbide layer 316 may be deposited. Dopants may be incorporated into silicon carbide layer 316 during the epitaxial growth. More specifically, a tip, a source and a drain implant of the memory array may be undertaken vertically into the layer 316 to ensure that the source-drain (SD) junctions stay within the silicon carbide layer 316 in order to minimize the junction leakage. FIG. 21 shows the cross section of the wafer 310 after the silicon carbide growth. Next, the masking layer 314 may be removed with typical wet etch. Following the flow process of FIG. 15 for the second embodiment, the transistors may be fabricated following silicon transistor processing steps. It should be noted that the oxide growth rate on silicon and silicon carbide may be different. As undertaken with the second embodiment, high-k dielectric gate material may be used instead of SiO as the gate dielectric. A hard mask for patterning the metal gate may be left on top for self-aligned contacts. After the spacer process, a wet etch may be performed to remove silicon under silicon carbide in the contact region. The self-aligned etching may provide isolation between silicon bodies of neighboring cells.

Figure 22:
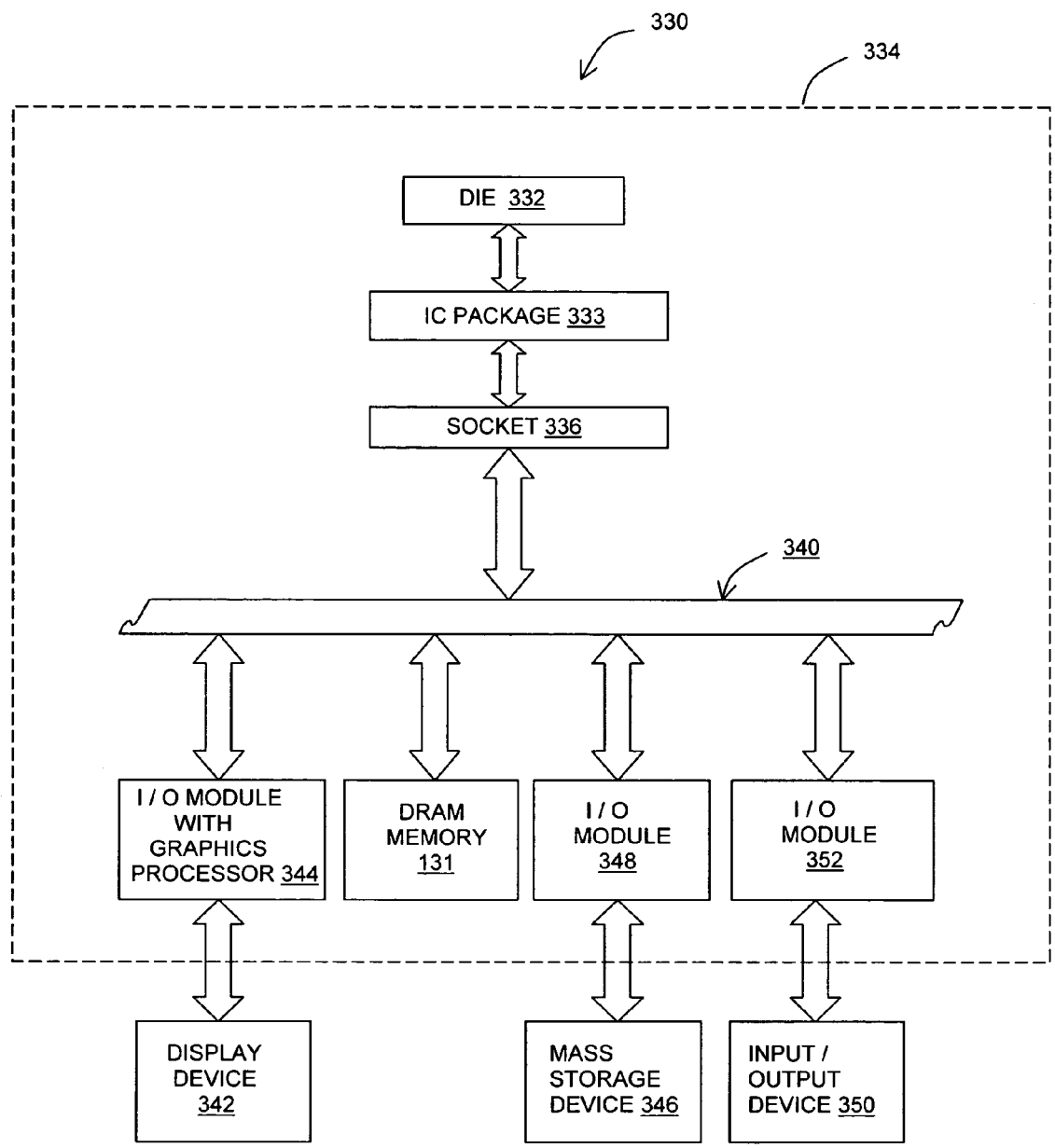
FIG. 22 is a system according to various embodiments of the present invention.

Referring to FIG. 22, there is illustrated a system 330, which is one of many possible systems in which a DRAM memory 331 may be used, such DRAM memory 331 including the memory array 92 of the first embodiment (FIG. 5), the memory array 220 of the second embodiment (FIG. 16) or the memory array 260 of the third embodiment (FIG. 17). The system 330 further includes an integrated circuit (IC) die 332 mounted in a semiconductor package 333. The semiconductor package 333 may be mounted on a substrate or printed circuit board (PCB) 334 via a socket 336. The IC die 332 of the semiconductor package 333 may be a processor and the PCB 334 may be a motherboard. However, in other systems the semiconductor package 333 may be directly coupled to the PCB 334 (eliminating the socket 336 which allows the semiconductor package 333 to be removable). In addition to the socket 336 and the semiconductor package 333, the PCB 334 may have mounted thereon the DRAM memory 331 and a plurality of input/output (I/O) modules for external devices or external buses, all coupled to each other by a bus system 340 on the PCB 334. More specifically, the system 330 may include a display device 342 coupled to the bus system 340 by way of an I/O module 344, with the I/O module 344 having a graphical processor and a memory. The I/O module 344 may be mounted on the PCB 334 as shown in FIG. 22 or may be mounted on a separate expansion board. The system 330 may further include a mass storage device 346 coupled to the bus system 340 via an I/O module 348. Another I/O device 350 may be coupled to the bus system 340 via a network interface I/O module 352. Additional I/O modules may be included for other external or peripheral devices or external buses.

Examples of the mass storage device 346 include, but are not limited to, a hard disk drive, a compact disk drive (CD), a digital versatile disk driver (DVD), a floppy diskette, a tape system and so forth. Examples of the input/output devices 350 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 334. Examples of the bus system 340 include, but are not limited to, a peripheral control interface (PCI) bus, and Industry Standard Architecture (ISA) bus, and so forth. The bus system 340 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 340. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the IC die 332 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   an insulating layer;
   a plurality of spaced-apart semiconductor lines formed on the insulating layer;
   a plurality of spaced-apart conductive gate lines formed on the insulating layer, with each of the plurality of gate lines being disposed to intersect the plurality of semiconductor lines at a plurality of intersections and including a plurality of front gates and a plurality of back gates;
   the plurality of semiconductor lines including a plurality of body regions disposed at the plurality of intersections, with each of the plurality of body regions including a channel and each of the plurality of body regions being formed from a silicon carbide material; and
   at least one of the plurality of body regions having a pair of gate-adjacent opposed sides with one of the front gates being adjacent to one of the pair of gate-adjacent opposed sides and one of the back gates being adjacent to the other one of the pair of gate-adjacent opposed sides.

2. The apparatus according to claim 1, wherein the plurality of spaced-apart semiconductor lines are formed from a silicon carbide material.

3. The apparatus according to claim 1, further comprising a silicon carbide substrate and wherein the insulating layer is a buried oxide layer in the silicon carbide substrate.

4. The apparatus according to claim 1, wherein the at least one body region further includes a pair of region-adjacent opposed sides; the semiconductor lines further includes a source region disposed adjacent to one of the pair of region-adjacent opposed sides and a drain region disposed adjacent to the other one of the pair of region-adjacent opposed sides.

5. The apparatus according to claim 4, wherein the gate-adjacent pair of opposed sides are substantially perpendicular to the region-adjacent pair of opposed sides; and the apparatus further comprises: a voltage bias source; a word-line selection source; a plurality of bit lines; the one front gate is coupled to the word-line selection source; the back one gate is coupled to the voltage bias source; and the drain region is coupled to one of the plurality of bit lines.

6. The apparatus according to claim 5, wherein the apparatus further comprises a gate insulating oxide layer interposed between the gates and the body regions.

7. The apparatus according to claim 5, wherein the plurality of semiconductor lines are substantially parallel to each other; the plurality of gate lines are substantially parallel to each other; and the plurality of semiconductor lines are disposed in substantially perpendicular relationship to the plurality of gate lines.

8. An apparatus, comprising:
   an insulating layer;
   a plurality of spaced-apart semiconductor lines formed on the insulating layer;
   a plurality of spaced-apart conductive gate lines formed on the insulating layer, with each of the plurality of gate lines being disposed to intersect the plurality of semiconductor lines at a plurality of intersections;
   the plurality of semiconductor lines including a plurality of body regions disposed at the plurality of intersections, with each of the plurality of body regions including a channel and each of the plurality of body regions being formed from a silicon carbide material; and
   a silicon substrate; and wherein the insulating layer is a buried oxide layer in the silicon substrate.

9. The apparatus according to claim 8, wherein each of the body regions further includes a first pair of opposed sides; and the semiconductor lines further includes a source region disposed adjacent to one of the first pair of opposed sides and a drain region disposed adjacent to the other one of the first pair of opposed sides.

10. The apparatus according to claim 9, wherein the body region includes a second pair of opposed sides substantially perpendicular to the first pair of opposed sides; and the apparatus further comprises a voltage bias source; a word-line selection source; a plurality of bit lines; a first gate disposed adjacent to one of the second pair of opposed sides; a second gate disposed adjacent to the other one of the second pair of opposed sides; the first gate being part of one of the plurality gate lines and being coupled to a word-line selection source; and the second gate being part of the one gate line and being coupled to the voltage bias source; and the drain region being coupled to one of the plurality of bit lines.

11. The apparatus according to claim 10, further comprising a dielectric material disposed between the first and the second gates and the body region and disposed in a substitute layer between the body region and the insulating layer.

12. The apparatus according to claim 10, wherein the first and the second gates are made of metal.

13. The apparatus according to claim 10, wherein the plurality of semiconductor lines are substantially parallel to each other, the plurality of gate lines are substantially parallel to each other; and the plurality of semiconductor lines are substantially perpendicular to the plurality of gate lines.

14. An apparatus, comprising:
   an insulating layer;
   a plurality of spaced-apart semiconductor lines formed on the insulating layer;
   a plurality of spaced-apart conductive gate lines formed on the insulating layer, with each of the plurality of gate lines being disposed to intersect the plurality of semiconductor lines at a plurality of intersections;
   the plurality of semiconductor lines including a plurality of body regions disposed at the plurality of intersections, with each of the plurality of body regions including a channel and each of the plurality of body regions being formed from a silicon carbide material; and wherein each of the plurality of semiconductor lines further includes a silicon carbide line having a portion of the plurality of body regions and a silicon line disposed between the silicon carbide line and the insulating layer.

15. The apparatus according to claim 14, further comprising a silicon substrate and wherein the insulating layer is a buried oxide layer in the silicon substrate.

16. The apparatus according to claim 14, wherein each of the body regions further includes a first pair of opposed sides; the silicon carbide lines further includes a source region disposed adjacent to one of the first pair of opposed sides and a drain region disposed adjacent to the other one of the first pair of opposed sides; and the apparatus further comprises a plurality of bit lines with the drain region being electrically coupled to one of the bit lines.

17. The apparatus according to claim 16, wherein each of the plurality of the body regions further includes a second pair of opposed sides substantially perpendicular to the first pair of opposed sides; each of the silicon lines including a plurality of silicon regions with one of the silicon regions being adjacent to one of the body regions and the apparatus further comprises a plurality of gates formed in each of the plurality of gate lines with each of the gates being disposed adjacent to the second pair of opposed sides of one of the body regions.

18. The apparatus according to claim 17, wherein each of the gates is further disposed adjacent to another side of the body region, with the another side being disposed between the second pair of opposed sides.

19. The apparatus according to claim 17, further comprising a word-line selection source coupled to each of the plurality of gate lines and a bit-line driving source coupled to each of the plurality of bit lines and wherein the source region is coupled to ground; the word-line selection source and the bit line driving source being operable to provide a pair of voltages of different polarities to store a selected one of a binary zero or a binary one and being operable to provide a pair of voltages of the same polarity to store the other one of the binary zero or the binary one.

20. The apparatus according to claim 17, wherein the plurality of semiconductor lines are substantially parallel to each other, the plurality of gate lines are substantially parallel to each other; and the plurality of semiconductor lines are substantially perpendicular to the plurality of gate lines.

* * * * *